United States Patent
Momtaz et al.

(10) Patent No.: US 7,630,466 B2
(45) Date of Patent: Dec. 8, 2009

(54) SEARCH ENGINE FOR A RECEIVE EQUALIZER

(75) Inventors: Afshin Momtaz, Laguna Hills, CA (US); Rajesh Satapathy, Lake Forest, CA (US); Chung-Jue Chen, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 598 days.

(21) Appl. No.: 11/281,204

(22) Filed: Nov. 15, 2005

(65) Prior Publication Data

US 2007/0110148 A1    May 17, 2007

(51) Int. Cl.
*H04B 1/10* (2006.01)
(52) U.S. Cl. .............. 375/350; 375/229; 375/230; 375/231; 375/232; 375/233; 375/371; 375/373

(58) Field of Classification Search ......... 375/229–236, 375/350, 371–377
See application file for complete search history.

(56) References Cited

U.S. PATENT DOCUMENTS

2005/0271137 A1\* 12/2005 Kolze et al. ............... 375/233
2006/0251195 A1\* 11/2006 Chen et al. ................ 375/348

\* cited by examiner

*Primary Examiner*—Curtis B Odom

(57) ABSTRACT

A search engine selects initial coefficients for a receive equalizer. The search engine may be incorporated into a communication receiver that includes a decision feedback equalizer and clock and data recovery circuit. Here, the search engine may initialize various adaptation loops that may control the operation of, for example, a decision feedback equalizer, a clock and data recovery circuit and a continuous time filter. The receiver may include an analog-to-digital converter that is used to generate soft decision data for some of the adaptation loops.

29 Claims, 7 Drawing Sheets

SEARCH ENGINE FOR A RECEIVE EQUALIZER

TECHNICAL FIELD

This application relates to data communications and, more specifically, to a search engine for initializing a receive equalizer.

BACKGROUND

In a typical data communications system data is sent from a transmitter to a receiver over a communications media such as a wire or fiber optic cable. In general, the data is encoded in a manner that facilitates effective transmission over the media. For example, data may be encoded as a stream of binary data (e.g., symbols) that are transmitted through the media as a serial signal.

Typically, a separate clock signal is not sent with the serial signal. As a result, a receiver in a serial communication system may include a clock and data recovery circuit ("CDR") that generates a clock signal that is synchronized with the incoming data stream. For example, the clock and data recovery circuit may process the incoming data stream to generate a clock signal at a frequency that matches the frequency of the data stream. The clock is then used to sample or recover the individual data bits (e.g., "symbols") from the incoming data stream.

In a typical high speed application, symbols in a data stream are distorted as they pass through the media. For example, bandwidth limitations inherent in the media tend to spread the transmitted pulses. As a specific example, in optical communication systems chromatic dispersion and polarization mode dispersion which result from variation of light propagation speed as a function of wavelength and propagation axes may cause symbol spread.

If the width of the spread pulse exceeds a symbol duration, overlap with neighboring pulses may occur, degrading the performance of the receiver. This phenomenon is called inter-symbol interference ("ISI"). In general, as the data rate or the distance between the transmitter and receiver increases, the bandwidth limitations of the media tend to cause more inter-symbol interference.

To compensate for such problems in received signals, conventional high speed receivers may include filters and/or equalizers that, for example, cancel some of the effects of inter-symbol interference or other distortion. Examples of such components include a decision feedback equalizer ("DFE") and a finite impulse response filter ("FIR").

Moreover, some applications use adaptive filters or equalizers that automatically adjust their characteristics in response to changes in the characteristics of the communications media. Typically, the adaptation process involves generating coefficients that control the characteristics of the filter or equalizer. To this end, a variety of algorithms have been developed for generating these coefficients.

In some receiver architectures, it may be necessary to initialize some or all of the components of the system such as the equalization components. For example, when a system is reset the coefficients for these components may be randomly set by transient conditions or noise. However, a given receiver may not operate properly with every possible combination of coefficient values. Hence, it may be necessary to select a particular combination that will cause the receiver to operate properly. It may not be possible, however, to predict in advance which coefficient values will work in a particular operating environment. Consequently, a need exists for effective and efficient techniques for initializing equalization and other components in communication receivers.

SUMMARY

A system and/or method of initializing a receive equalizer, substantially as shown in and/or described in connection with at least one of the figures, as set forth more completely in the claims.

BRIEF DESCRIPTION OF THE DRAWINGS

These and other features, aspects and advantages of the present invention will be more fully understood when considered with respect to the following detailed description, appended claims and accompanying drawings, wherein:

FIG. 5, including

Figure 1:
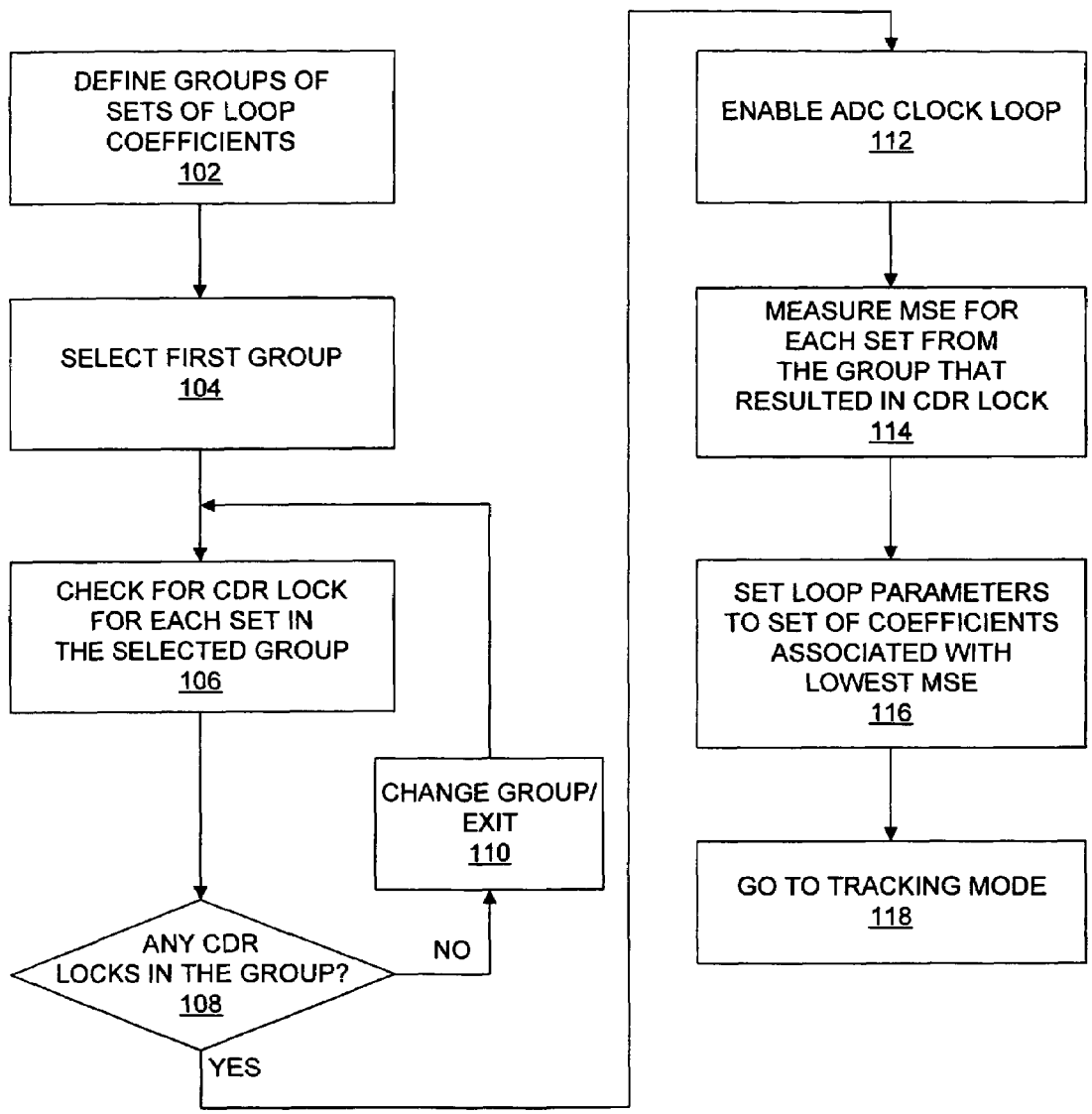
FIG. 1 is a flow chart of one embodiment of search engine operations that may be performed in accordance with the invention.

In accordance with common practice the various features illustrated in the drawings may not be drawn to scale. Accordingly, the dimensions of the various features may be arbitrarily expanded or reduced for clarity. In addition, some of the drawings may be simplified for clarity. Thus, the drawings may not depict all of the components of a given apparatus or method. Finally, like reference numerals denote like features throughout the specification and figures.

DETAILED DESCRIPTION

The invention is described below, with reference to detailed illustrative embodiments. It will be apparent that the invention may be embodied in a wide variety of forms, some of which may be quite different from those of the disclosed embodiments. Consequently, the specific structural and functional details disclosed herein are merely representative and do not limit the scope of the invention. For example, references to specific structures and processes in the disclosed embodiments should be understood to be but one example of structures and processes that may be used in these or other embodiments in accordance with the teachings provided herein. Also, references to "an" or "one" embodiment in this discussion are not necessarily to the same embodiment, and such references mean at least one.

In one aspect, the invention relates to identifying an initial set of coefficients for at least one equalization component in a receiver. In general, an equalization component may be any component that serves to improve the recovery of data from a received signal. Accordingly, an equalization component may include, for example, a filter, an equalizer such as a DFE, timing mechanisms associated with recovering a signal (e.g., a clock and data recovery circuit), etc. A set of coefficients may include one or more coefficients.

In some embodiments the identification operations may be performed by a search engine associated with a communication receiver. In one embodiment the receiver includes at least one equalization component and a clock recovery circuit (e.g., a CDR).

The function of an equalization component may be controlled by at least one adaptation loop. For example, the function of the component may be adjusted by configuring one or more parameters associated with the component with selected coefficient values. A feedback mechanism may be employed to determine which coefficient values result in the best performance of the component. For example, the coefficient may be adjusted to reduce the amount of error in the recovered signal.

In receiver architectures where a CDR follows an equalizer, it is possible that some equalization settings (e.g., coefficient values) may adversely affect the input signal to the CDR to such an extent that the CDR is unable to lock to the incoming signal. Since a locked clock may be used to optimize the equalizer coefficients, it is possible that the receiver may become stuck in a mode where lock is never acquired.

In one aspect of the invention, a search engine may sequentially program various sets of coefficients into the receiver to determine which set or sets of coefficient values result in CDR lock. It may be necessary to try more than one set because in some applications the characteristics of the channel and/or other factors may lead to an inability to define a single set that results in CDR lock for all systems and all operating conditions.

In one aspect of the invention, one of the sets of coefficients may be selected as the initial set for the loops based on a square error criteria. For example, a mean square error ("MSE") measurement may be made when the loops are programmed with each of the sets of coefficients. The set that results in the lowest MSE may then be select as the initial set.

Advantageously, this technique may result in the adaptation loops being initialized to values that do not result in an immediate loss of CDR lock once the loops are allowed to adapt. Such a situation could arise in a conventional system, for example, when the initial coefficients that were selected are at or near a "boundary" of a CDR locking region. Given that the adaptation algorithm may not know where these coefficients are with respect to this boundary, the adaptation algorithm could initially attempt to adjust the coefficients in the wrong direction. As a result, a conventional system may adjust the coefficients to values that correspond to a region outside the CDR locking region which may cause the CDR to lose lock. In contrast, selection of a set of coefficients that results in a lower MSE than other sets may result in the ultimately selected set being further from a "boundary" than other sets.

In some embodiments of the invention, the receiver may include an analog to digital converter ("ADC") that is used to generate data for the MSE calculation. In one aspect of the invention, the initialization process may enable a timing loop for the ADC to optimize before performing the MSE calculations for the sets of coefficients.

In one aspect of the invention, groups of the sets of coefficients are defined. A first one of these groups may include a relatively small number of sets. In addition, the sets may be selected such that there is a relatively high probability that one of the sets in the group will result in CDR lock. Thus a search engine may try this group first in an attempt to quickly identify a set that results in CDR lock.

In the event CDR lock is not achieved using the first group the search engine may try a second group of sets. The second group may include a relatively large number of sets. Thus, although it may take a relatively long time to try all of the sets in this group, there may be a very high probability that one of the sets in the group will result in CDR lock.

Using this technique, the initialization process may improve the time it takes to identify a preferred set of coefficients. Here it should be appreciated that it may take a relatively long time to acquire lock after the coefficients are changed. Accordingly, it may prove advantageous to keep to a minimum the number of sets of coefficients that are initially tested for CDR lock.

Referring to FIG. 1, an example of one embodiment of an initialization process will be described. Initially several groups of sets of coefficients are defined for the search process (block 102). For example, a first relatively small (in number) group of sets may be defined that result in lock for the majority of systems and operating conditions. One or more other groups of sets may then be defined that result in lock for other systems and operating conditions. For example, in one embodiment, a first small group may include 6 sets of coefficients that collectively may result in lock 95% of the time, while a second larger group may include 24 sets of coefficients that collectively may also result in lock for approximately the remaining 5% of the cases.

It should be appreciated that other groups of sets may be defined that include various types of coefficients, various coefficient values, various numbers of coefficients in each set, etc. Moreover, such groups and sets may result in lock a percentage of time that depends on the system design and operating conditions (e.g., temperature, channel, noise, etc.).

A variety of criteria may be utilized for determining which loop coefficients are to be included in a set and the values for those coefficients. For example, simulations or tests may be run to determine which coefficients have the most impact on the CDR not locking. In some applications, the initial values for the selected coefficients may be set to provide several values across the spectrum of possible values for that coefficient. In some applications, it may be possible to find a value for a given coefficient that works well in all or most cases.

The search engine then attempts to determine which of the sets of coefficients in a first smaller group results in lock. Accordingly, as represented by block 104, the search engine initially selects the first group of sets to test. As noted above, preferably this group of sets is defined such that, for a significant percentage of systems and conditions, at least one of the sets in this group results in a lock condition.

As represented by block 106, the search engine determines whether lock may be achieved with any of the sets in the selected group. In some embodiments the search engine disables the adaptation of the corresponding loops, sets the loop parameters to one of the set of coefficients, and determines whether this set results in lock. The search engine then repeats this process for the other sets in the selected group.

As represented by block 108, if none of the sets in the first group result in lock, the search engine may perform the operations of block 106 for each of the sets defined in one or more other groups (block 110). In one embodiment a second group includes more sets than the first group. In this way, although it may take longer to test all of the sets in the second group, a high probably of achieving lock may be realized at this phase of the process. In the event lock is not achieved for any of the sets of coefficients in any of the groups, the search engine may exit the loop to restart from the beginning (e.g., block 102) or it may exit the loop and generate an appropriate error indication (block 110).

When more than one of the sets results in CDR lock, the search engine selects one of the sets depending on which set is associated with the lowest error (e.g., MSE, sum square error, etc.). For convenience, the term MSE may be used herein to refer in a general sense to error. As represented by block 112, in some embodiments the search engine enables an ADC clock loop and allows that loop to optimize before measuring MSE. Here, the ADC may be used to generate data that serves as the basis for the MSE calculation. Accordingly, it may be desirable to ensure that the data upon which the MSE calculation is based is as reliable as possible. As represented by block 114, the search engine may then sequentially change the loop parameters to the values defined in each set, allow the system to converge, then measure the MSE for each set.

As represented by block 116, the search engine sets the initial loop parameters to the set of coefficients that provided the best (e.g., lowest) MSE measurement. As represented by block 118, the search engine then turns the system over to a tracking mode. In tracking mode the adaptation loops are allowed to converge to their optimum values.

Figure 2:
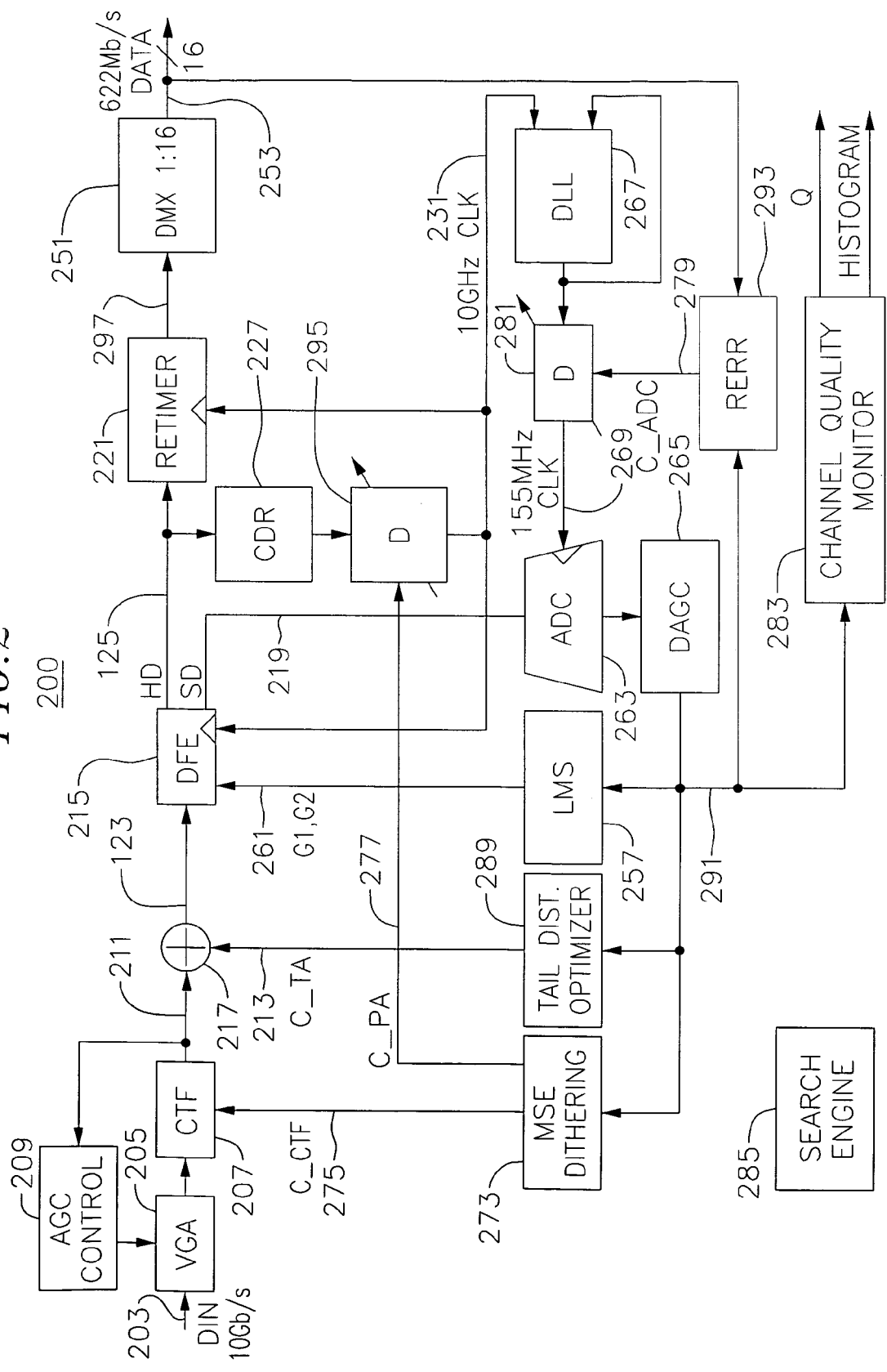
FIG. 2 is a simplified block diagram of one embodiment of a data communication receiver constructed in accordance with the invention.

Additional details of a loop initialization process may be better explained by reference to specific loops in a communication receiver. Referring to FIG. 2, one embodiment of a communication receiver 200 employs several adaptation loops to extract a clock and data from a received signal. To avoid undesirable interactions between the loops, the loops may be implemented using different error criteria, different error algorithms and different bandwidths.

The operation of the receiver 200 will be described in an example where data is recovered from a 10 Gbits per second ("Gbps") serial data signal received from, for example, an optical channel. It should be appreciated, however, that the techniques described herein may be applicable to other applications including other receiver types, architectures, data rates and control loops.

The receiver includes an input stage for amplifying and filtering a received signal 203. The input stage includes a variable gain amplifier ("VGA") 205, a continuous time filter ("CTF") 207 and an automatic gain control ("AGC") circuit 209. This input stage provides a conditioned and relatively constant amplitude signal to the DFE.

The variable gain amplifier 205 amplifies the input data signal 203 in accordance with a control signal received from the AGC circuit 209. The amplified output of the VGA is provided to the continuous time filter 207.

The continuous time filter 207 filters the data signal using, for example, a low pass filter that has an adjustable bandwidth. In general, the CTF reshapes received input pulses to improve the performance of the DFE.

In the embodiment of FIG. 2, a dithering algorithm circuit 273 generates a bandwidth adjust signal ("C_CTF") 275 to control the bandwidth of the continuous time filter 207. Here, the dithering algorithm circuit 273 may adjust the signal 275 such that a measured mean square error associated with the received signal is minimized.

A filtered data signal 211 from the continuous time filter 207 is fed back to the automatic gain control circuit 209. Under the control of the automatic gain control circuit 209 the variable gain amplifier 205 may appropriately amplify or attenuate small or large amplitude input signals, respectively, to generate an output signal having relatively constant amplitude. In some embodiments the AGC 209 filters a peak detect output through a digital accumulator to generate the control signal provided to the VGA 205. In general, the AGC loop runs continuously and independently of the other loops in the receiver 200.

A threshold adjust loop optimizes the DC level of the data signal 211 from the continuous time filter 207. This DC level optimization is equivalent to optimizing the decision threshold of the DFE slicer. Here, a threshold adjust circuit 217 combines (e.g., adds) a control signal ("C_TA") 213 from a tail distribution optimizer 289 to the data signal 211. A resultant signal 223 is then provided to a decision feedback equalizer ("DFE") 215.

The DFE equalizes the signal 223 by combining the signal 223 with equalized feedback signals (not shown) that may be scaled by one or more equalizer coefficient signals 261. The decision feedback equalizer 215 has an internal feedback loop (not shown in FIG. 2) whereby internal feedback signals are multiplied by (in a two-tap equalizer example) equalization coefficients G1 and G2 (typically negative numbers) provided by signals 261. The resulting scaled equalized feedback signals are added by an internal summer (not shown in FIG. 2) to the data signal 223. Thus, the decision feedback equalizer 215 may subtract a scaled version of one or more previous symbols from a current (that is, current in time) symbol to reduce or eliminate channel induced distortion such as inter-symbol interference.

In general, the values of the equalization coefficients G1 and G2 depend on the level of inter-symbol interference that is present in the incoming signal. Typically the absolute value of an equalization coefficient increases with increasing inter-symbol interference.

The coefficient signals 261 are generated by a LMS algorithm-based adaptation loop. This iterative algorithm updates each coefficient based on its estimate of error obtained from processing an equalized soft decision ("SD") signal 219 generated by the decision feedback equalizer 215.

The decision feedback equalizer 215 also generates a hard decision data signal 225 (e.g., a binary data signal). As discussed below, the hard decision signal may be generated by, for example, slicing the soft decision signal.

A clock recovery ("CDR") circuit 227 extracts a 10 GHz clock signal 231 (in this 10 Gbps receiver example) from the binary data signal 225 by, for example, aligning the rising edge of the extracted clock 231 with transitions in the binary signal 225. In this way, the clock recovery circuit 227 may maintain a desired timing relationship between the binary data signal 225 and the clock signal 231 that the retimer 221 uses to retime the binary data signal 225.

A clock and data recovery adaptation loop may be used to optimize the phase of the recovered clock signal 231. In one embodiment, a phase adjust circuit 295 is controlled by a control signal ("C_PA") 277 to, for example, make relatively small adjustments in the phase of the clock signal 231. For example, the control signal 277 may create an offset in the detected phase relationship between the clock signal 231 generated by the CDR 227 and the binary data signal 225. The dithering algorithm circuit 273 may then adjust the control signal 277 (thereby affecting the delay) to reduce a mean square error associated with the received signal. Examples of decision feedback equalizers with adjustable clock recovery delay are disclosed in U.S. patent application Ser. No. 10/774,725, filed Feb. 9, 2004, the disclosure of which is hereby incorporated by reference herein.

The binary signal 225 is retimed by a retimer 221 to generate an output data signal 297. The signal 297 thus constitutes equalized data that has been recovered from the incoming data signal 203.

In some embodiments, a demultiplexer ("DMX") 251 demultiplexes the recovered data signal 297 to generate parallel data signals that are clocked at a slower rate. For example, in FIG. 2 the demultiplexer 251 generates sixteen parallel data signals 253 at a rate of 622 Mbits per second ("Mbps").

In FIG. 2, error information for several of the adaptation paths is obtained from a digitized version of the soft decision signal 219. An analog to digital converter 263 samples the soft decision signal 219 to generate digital signals that are normalized by a digital automatic gain control circuit ("DAGC") 265. The digital output 291 of the digital automatic gain control circuit 265 is then provided to several of the adaptations loops.

In general, adaptation need not be performed at the incoming data rate. That is, the parameters that are being compensated for by the adaptation loops typically change at a rate that is significantly slower than the 10 Gbit data rate. As a result, adaptation may be performed at lower speeds to minimize the amount of power and area required by the receiver.

In some embodiments the analog to digital converter 263 samples the soft decision signal 219 using a 155 MHz clock signal 269 generated by a delay lock loop 267. The relative phase of the clock signal 269 determines the point in time in a given symbol of the signal 219 at which the analog to digital converter 263 samples the symbol.

In some embodiments the delay lock loop 267 works in conjunction with a variable delay circuit 281 that may be used to control, to some degree, the phase of the clock signal 269 in accordance with another adaptation loop. Here, a relative error circuit 293 may adjust a delay control signal ("C_ADC") 279 to vary the point at which the analog to digital converter 263 samples symbols from the soft decision signal 219. In this way, the analog to digital converter 263 may be controlled to sample at approximately the same point in time as the retimer 221. As shown in FIG. 2, the relative error circuit 293 may adjust the correction signal 279 based on at least a portion of output signal 253 and the DAGC output signal 291.

As mentioned above, an initialization phase invoked by search engine 285 may be used to ensure that the coefficients for one or more of the loops are at an acceptable initial value when the receiver is powered on or reset. Once an acceptable state is reached, the receiver enters a tracking phase where all the loops are enabled such that the loops will adapt simultaneously. To insure stability, a different operating speed (e.g., bandwidth) may be defined for various loops.

In some embodiments the components 257, 265, 273, 289 and 293 are implemented in the digital domain. Other components such as the search engine 285 and a channel quality monitor 283 also may be implemented in the digital domain. Accordingly, these components may be implemented, for example, as microcode for microprocessors, programmable logical grid arrays, as a state machine, a processor with associated software or similar structures and devices.

As mentioned above, the receiver 200 includes several adaptation loops for optimizing the recovery of data from the received signal. The operation of these loops will now be discussed in more detail.

As discussed above, a least mean square ("LMS") algorithm in the DFE loop generates the G1 and G2 coefficients based on the digitized soft decision signal 291. In general, an LMS algorithm generates adaptive coefficients by modifying the current coefficients based on an algorithm that takes into account current and prior samples of the received data. For example, for a two tap DFE the LMS algorithm may be described by the following equations:

$$g1(n)=g1(n-1)+\mu*e*y1 \qquad \text{EQUATION 1}$$

$$g2(n)=g2(n-1)+\mu*e*y2 \qquad \text{EQUATION 2}$$

where g(n−1) represents the coefficient immediately preceding coefficient (n), μ is a scalar that relates to, for example, the gain of a feedback loop and the speed with which the loop converges, e is an error signal, and y1 and y2 are prior samples of the received data.

The dithering algorithm circuit 273 uses the signal 291 to generate signals to control the CTF and CDR circuits. Specifically, the bandwidth adjust signal 275 controls the bandwidth of the continuous time filter 207 and the phase adjust signal 277 controls the phase adjust circuit 295 to adjust the phase of the clock signal 231. The phase adjusted clock signal 231 also affects the timing of the clock 269 generated by the delay lock loop circuit for the analog to digital converter 263. In other embodiments, the dithering algorithm may control any number of coefficients, values, loops or other parameters.

In some embodiments, the dithering algorithm circuit 273 modifies the signals 275 and 277 according to a mean square error associated with a received data signal. In FIG. 2, the mean square error is calculated from the digitized soft decision signal 291.

To calculate the square error, the system processes the digital signals 291 received from the digital automatic gain control circuit 265 (FIG. 2). In some embodiments a sum square error ("SSE") is generated rather than an MSE to avoid an extra processing step of scaling the SSE to a mean value.

A SSE calculator (not shown) may generate an initial error signal using an adder that subtracts the expected value of a received signal from the actual value of the received signal. Here, the expected value may be generated, for example, by slicing the received signal.

A squaring circuit then squares the initial error signal and a summing circuit sums the squared error signals to generate the SSE signal. If an MSE signal is desired the SSE may be normalized at this point. For convenience, the term MSE may be used in the discussions that follow. It should be appreciated, however, that the techniques described with regard to MSE may be applicable to other square error algorithms or other error algorithms.

The dithering algorithm circuit 273 may reduce MSE by measuring MSE, then adjusting one or more of the signals 275 and 277, then re-measuring the MSE to compare the new MSE with the prior MSE. If the MSE decreased, the circuit 273 continues to adjust the signals in the same direction (e.g., up or down) as before. If the MSE increased, the circuit 273 adjusts the signals in the opposite direction. The following equation describes one example of a dithering algorithm:

$$c(n)=c(n-1)+u(n)$$

$$u(n)=u(n-1) \text{ if MSE}(n)<\text{MSE}(n-1)$$

$$u(n)=-1*u(n-1) \text{ if MSE}(n)>\text{MSE}(n-1) \qquad \text{EQUATION 3}$$

where c is a coefficient or other parameter to be adjusted and u is a unit of adjustment to the coefficient.

In some embodiments the size of the adjustment of the coefficients is dependent on a state of the dithering device 273. For example, the dithering device 273 may have coarse, fine and freeze states such that a coefficient is modified in large steps, modified in small steps or held steady, respectively.

The different adjustment sizes affect the speed at which an optimum parameter value may be obtained. A large adjustment size allows the process to more quickly approach an optimum value if an initial parameter value is far from an optimum value. However, a large adjustment size may continually overshoot an optimum value. A fine or small adjustment size can more accurately pinpoint an optimum value, but a larger number of iterations may be required to reach the optimal value due to the small step size.

A transition to a freeze or hold state may be made when a threshold is reached. The freeze state locks the value of the parameter. Locking the parameter may prevent inefficiency and may improve the performance of a function associated with the parameter. Without the freeze state the value of the parameter may continuously shift around an optimal value that on average may result in poorer performance than a locked value close to the optimal value. In one embodiment, the parameter value that is locked in is an average of recent parameter values. In another embodiment, the parameter value locked in is the last value prior to the transition to the freeze state or a similar approximation of the optimal value.

It should be appreciated that the digitized soft decision signal 291 may be used in other adaptation loops and that the above or other adaptations loops may use one or more other signals as a basis for adjusting control signals (e.g., coefficients) for the loops. Moreover, mean square error generated from the signal 291 may be used for other purposes such as the loop initialization process. The generation of the soft decision signal will now be discussed in more detail in conjunction with FIGS. 3 and 4.

Figure 3:
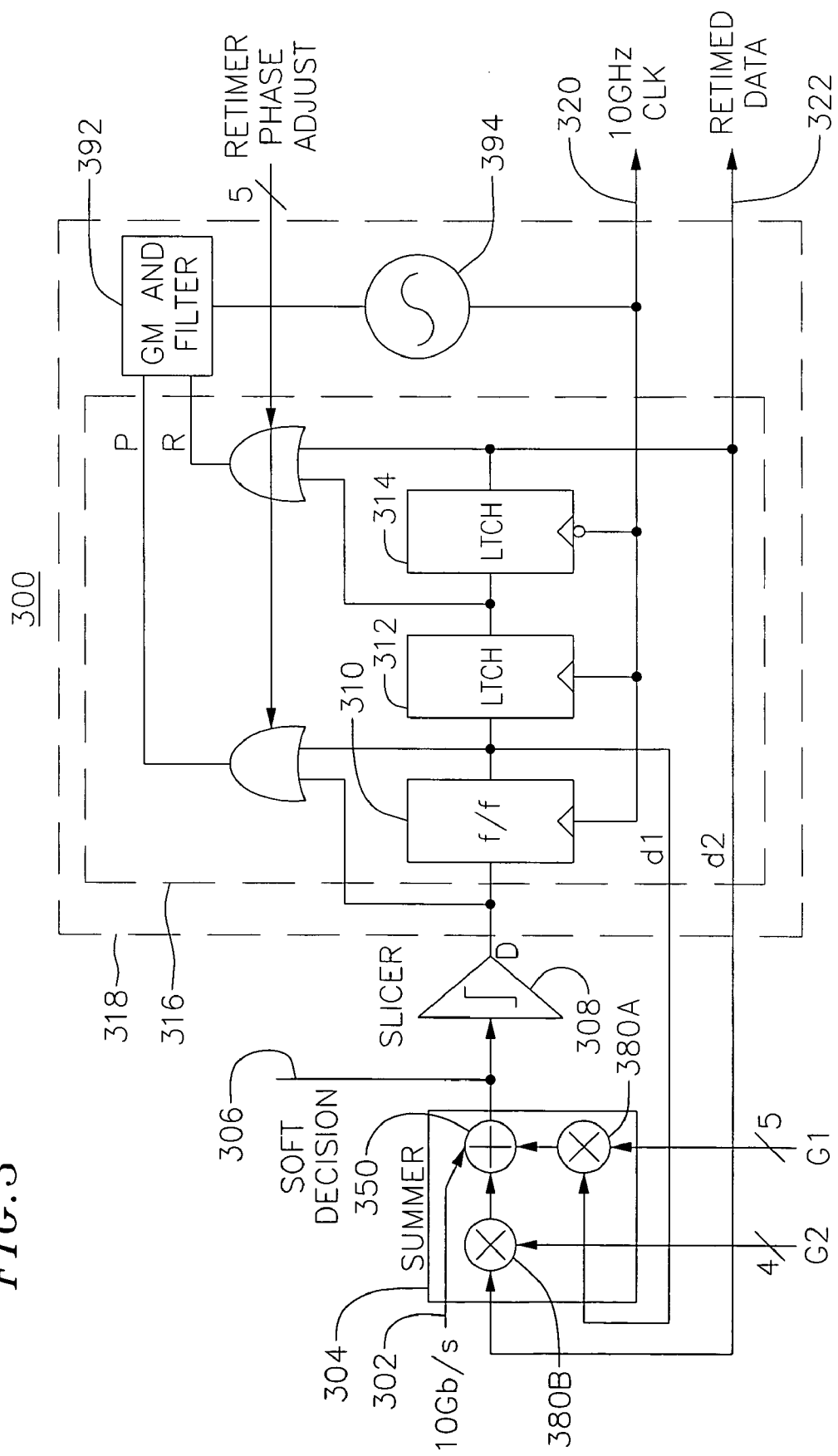
FIG. 3 is a simplified block diagram of one embodiment of a decision feedback equalizer and clock and data recovery circuit illustrating coefficients that may be used to control the equalization of the equalizer and the phase of the clock and data recovery circuit.

FIG. 3 illustrates one embodiment of a two tap decision feedback equalizer and clock and data recovery circuit 300 that may be used to generate the initial soft decision signal 219. The embodiment of FIG. 3 equalizes received data before it is retimed and incorporates an integrated phase detector and retimer. For example, an input signal 302 (e.g., signal 223 in FIG. 2) is equalized at a summer 304 that adds equalizer feedback signals d1 and d2 (as scaled by coefficients G1 and G2) to the input signal 302. The resultant soft decision signal 306 is provided to a slicer 308 and the output (D) of the slicer 308 is provided to a clock and data recovery circuit (represented by the components within dashed box 318). The clock and data recovery circuit extracts a clock signal 320 (e.g., signal 231 in FIG. 2) and retimes the received data to generate an output signal 322 (e.g., signal 297 in FIG. 2). By equalizing and retiming data in this manner, signal delay problems and clock recovery problems resulting from ISI that exist in conventional devices may be avoided. Accordingly, this architecture may facilitate operation at higher data rates and may operate more effectively in systems with relatively high ISI.

The phase detector comprises the components within dashed box 316. Here, it may be seen that latches in the phase detector are used to generate the retimed data 322. Specifically, the CDR phase detector flip-flops (flip-flop 310 and latch pair 312 and 314) also function as DFE retimers. These flip-flops may be shared because in the architecture of FIG. 3 the flip-flops for the CDR phase detector may operate from the same signals (e.g., binary data signal (D) and the extracted clock signal 320) as would the flip-flops for a DFE retimer. By integrating these phase detector and retimer components this architecture serves to advantageously reduce the number of high-speed components in the receiver.

The data output signals from the two flip-flops also provide the DFE tap signals (d1 and d2) for the DFE feedback loop. The output signals d1 and d2 are multiplied by equalization coefficients G1 and G2 at multipliers 380A and 380B, respectively, and provided to an adder 350. The adder 350 then combines the equalization signals with the input signal 302.

As discussed above, a slicer 308 digitizes the output 306 of the summer 304 to generate the binary data signal (D) that is provided to the first flip-flop 310. In this embodiment, the output of the second flip-flop provides the recovered data signal 322.

Outputs P and R from the phase detector 316 are provided to a charge pump and loop filter 392 which provides a voltage signal to a voltage controlled oscillator ("VCO") 394. The VCO 394 generates the extracted clock signal 320 that clocks the two flip-flops. Here, the phase of the clock signal 320 may be controlled by a set of retimer phase adjust signals (e.g., signal 277 in FIG. 2).

In some embodiments the soft decision signal 306 is used to generate error data for the adaptation loops. For example, the signal 306 may comprise the signal 219 described above in conjunction with FIG. 2. Here, it may be desirable to ensure that the basis for the error data accurately corresponds to the actual data that is generated by the receiver (e.g., the retimed data 322). Accordingly, provisions may be made to ensure that a sampler (e.g., ADC 263 in FIG. 2) samples a symbol in the soft decision signal 306 at a point in time (e.g., a given position in a time representation of the symbol) that corresponds to when the retimer (e.g., flip-flop 310) samples a symbol in the data (D). These timing issues will be discussed in more detail in conjunction with the circuit shown in FIG. 4.

Figure 4:
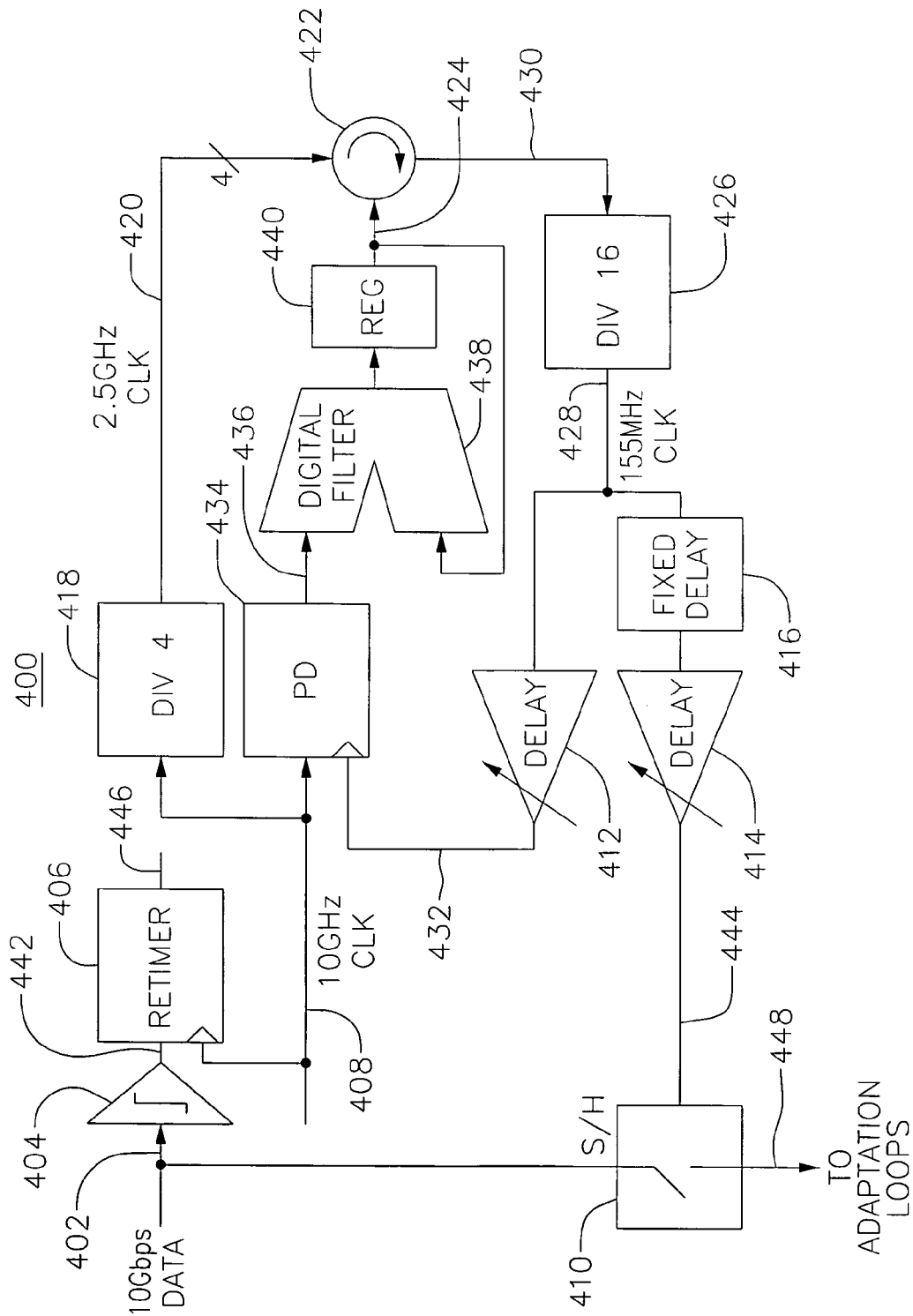
FIG. 4 is a simplified block diagram of one embodiment of a delay lock loop and analog to digital converter circuit that may be used to generate digital soft decision data for one or more adaptation loops.

FIG. 4 illustrates one embodiment of a delay lock loop and analog to digital converter timing circuit 400. An input signal 402, a slicer 404, a retimer 406 and an extracted clock signal 408 may respectively correspond to the signal 306, the slicer 308, the retimer (flip-flop 310 and latches 312 and 314) and the signal 320 in FIG. 3. Similarly, these components may respectively correspond to the signal 219, the slicer (in DFE 215), the retimer 221 and the signal 231 in FIG. 2. A sample and hold ("S/H") circuit 410 may correspond to the ADC 263 in FIG. 2. Variable delay buffers 412 and 414 and optional fixed delay element 416 may correspond to the variable delay element 281 in FIG. 2. For convenience, a delay adjust input signal (e.g., signal 279 in FIG. 2) is not illustrated in FIG. 4.

The remaining components shown in FIG. 4 may correspond to the delay lock loop 267 of FIG. 2. For example, the delay lock loop may comprise a divide-by-four circuit 418 that generates a 2.5 GHz clock signal 420 from the 10 GHz clock signal 408. The signal 420 comprises an input to a phase interpolator 422 that is controlled by a control signal 424. A divide-by-sixteen circuit 426 generates a 155 MHz clock signal 428 from an output 430 of the phase interpolator 422. The delay buffer 412 delays the signal 428 to provide a 155 MHz clock 432 to a phase detector 434. The phase detector 434 generates an error signal 436 in accordance with a phase difference between the signals 432 and 408. A circuit including a filter 438 and a register 440 filters and accumulates the error signal 436 to generate the control signal 424.

As discussed above, it may be desirable to ensure that the sample-and-hold circuit 410 samples a symbol in the soft decision signal 402 at a point in time (e.g., a position in a time representation of the symbol) that corresponds to when the retimer 406 samples a symbol in its input data 442 (e.g., data (D) in FIG. 3). For example, if one sampler is sampling in the middle of the "eye" of a given symbol, it is desirable to have the other sampler also sample in the middle of the "eye" of its sample.

A conventional phase alignment (e.g., PLL or DLL) scheme may not provide the desired correlation between the sample times of the sample-and-hold circuit 410 and the retimer 406. For example, in a conventional scheme the delay elements 412, 414 and 416 may not be present. Thus, the 155 MHz clock 428 may be used to clock the sample-and-hold circuit 410 and would serve as the lower input signal (instead of signal 432) to the phase detector 434.

Even assuming, however, that the delay lock loop was capable of perfectly aligning the clock signals 408 and 428, the sampling times of the retimer and the sample-and-hold circuit 410 would differ due to the delay imparted by the slicer 404 on the signal 442 sampled by the retimer 406. Moreover, in practice, additional phase inaccuracies may be imparted on the clocks 408 and 428 by other components of the system. For example, the sample and hold times of the samplers 406 and 410 may differ. In addition, the phase detector 434 may not precisely detect phase differences and/or generate absolutely precise error signals to compensate for the phase differences. Also, the delays in the circuit may vary depending on the temperature of the circuit.

To compensate for these delays, the delay elements 412, 414 and 416 may be used to adjust the relative phase of the clock 408 that is used to generate output data 446 and a clock 444 that is used to generate data 448 for the adaptation loops. Here, the fixed delay element 416 may be used to coarsely compensate for the delays in the circuit. For example, the delay of the element 416 may be set to a value that corresponds to typical delays (e.g., the delay through the slicer 404, etc.) in the circuit.

The delay elements 412 and 414 may be used to adjust the relative phases of the clocks 408 and 444. For example, an increase in the delay of the delay element 412 and/or a decrease in the delay of the delay element 414 will cause the phase of the clock 444 to move in a leading direction with respect to the clock 408. Conversely, a decrease in the delay of the delay element 412 and/or an increase in the delay of the delay element 414 will cause the phase of the clock 444 to move in a lagging direction with respect to the clock 408.

Based on the timing of the clock 444, the sampler 410 generates a sampled soft decision signal 448 (e.g., an analog or digital sample) that may be used to generate MSE data as discussed above. In general, this MSE data provides an estimate of the true error in the received signal (e.g., the signal through the path from signal 203 to signal 297). As discussed above, this MSE calculation may be used by the search engine to identify an initial combination of coefficients to be programmed into the adaptation loops.

Figure 5A:
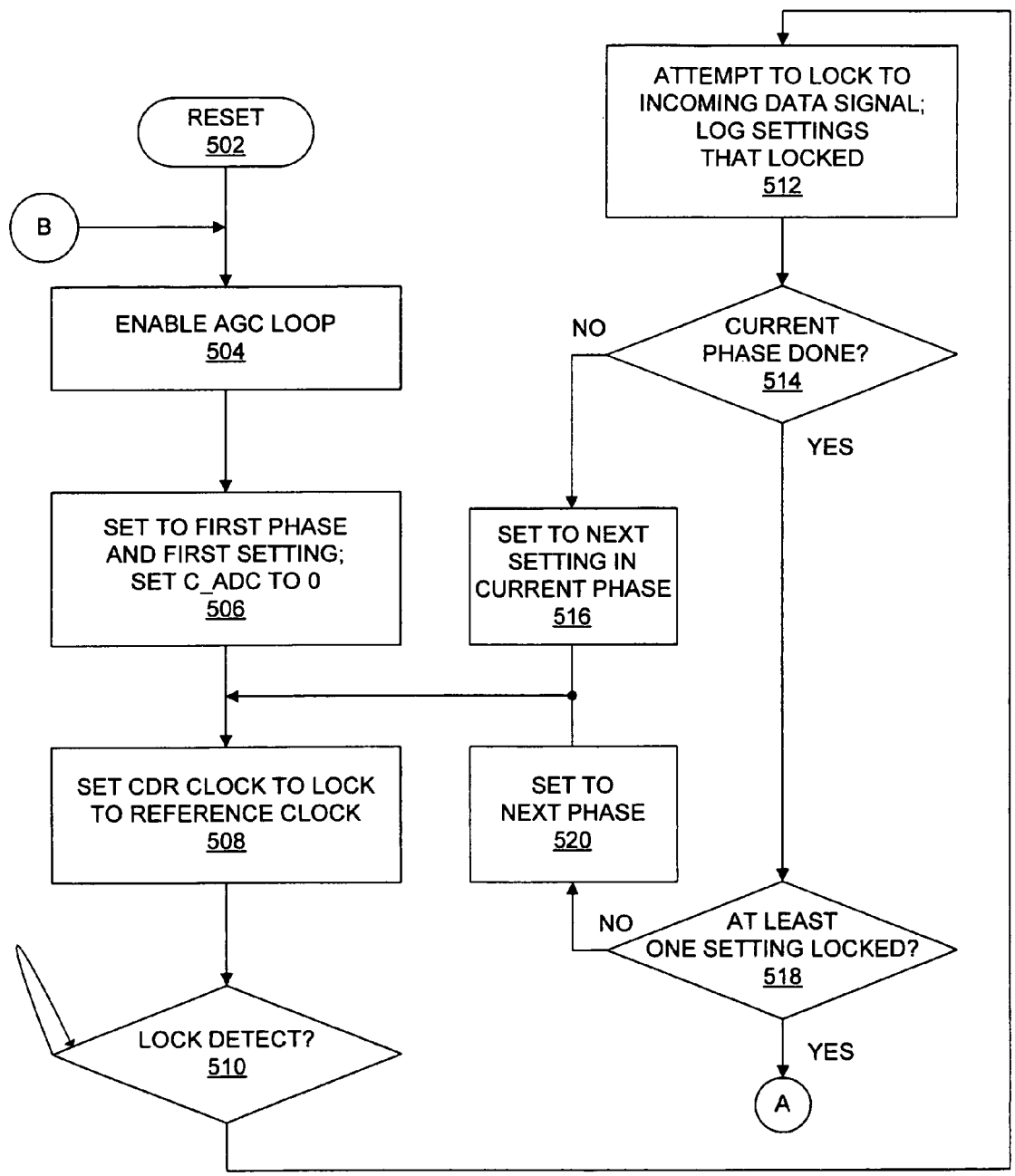
FIGS. 5A and 5B, is a flow chart of one embodiment of search engine operations that may be performed in accordance with the invention.
Figure 5B:
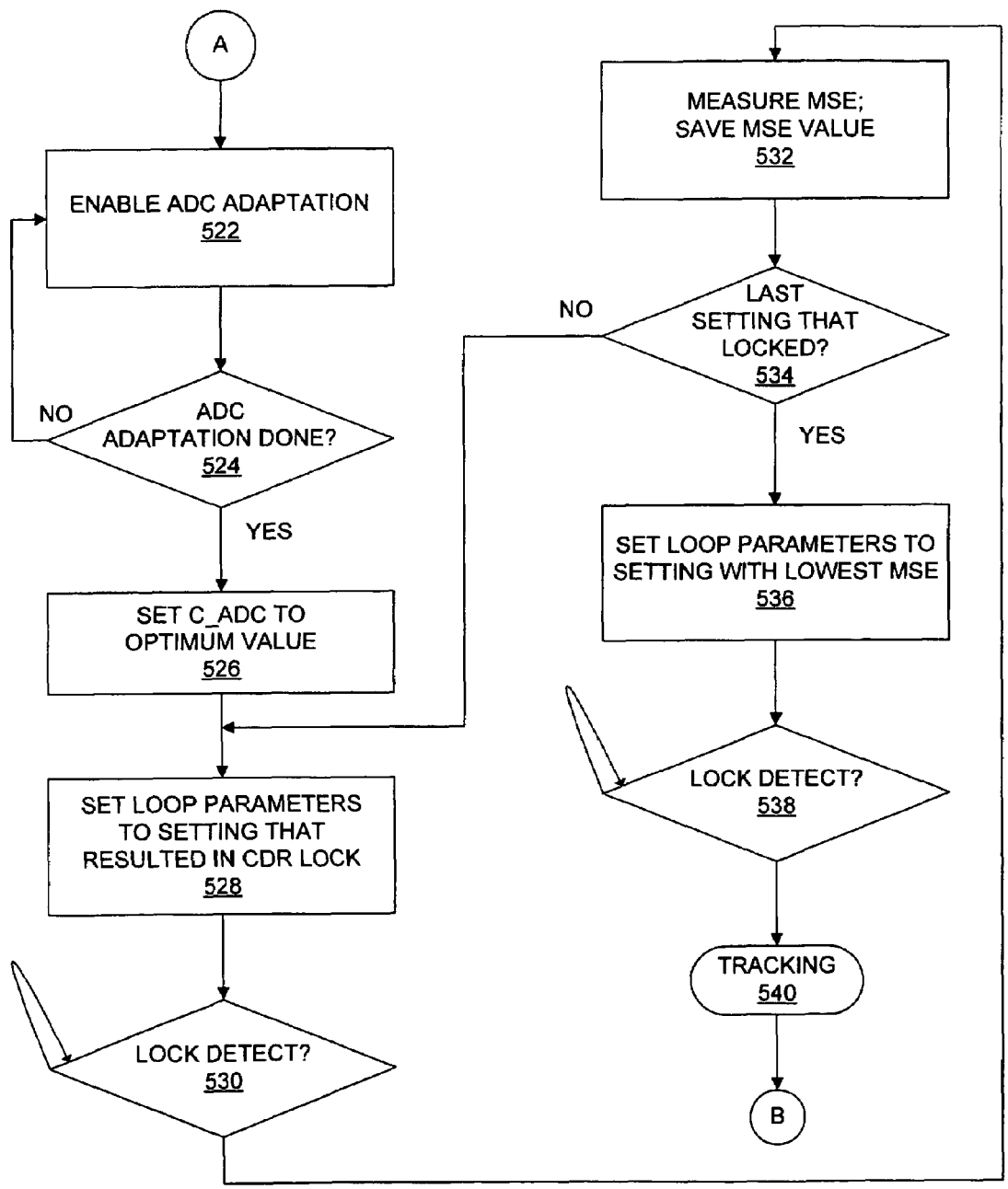

Referring to FIG. 5, one embodiment of search engine operations that may be performed in a system such as the one shown in FIG. 2 will be described in more detail.

Briefly, the operations represented by blocks 506-520 involve setting the parameters of the loop components using various coefficient combinations to determine which combinations result in CDR lock. Here each combination may include, for example, coefficients for the CTF 207, the DFE 215 and the phase adjust circuit 295.

In this example, two separate phases are defined, each of which is associated with a different group of coefficient combinations. In this way, a group of combinations that has a high probability of obtaining lock may be tried first. Moreover, the first phase may be relatively fast since it may include a relatively small number of combinations. Then, as a back-up in case the first phase does not result in CDR lock, a second group of combinations may be used in the second phase. This second group of combinations may include a larger number of combinations to increase the likelihood that CDR lock may be achieved during this phase.

The operations represented by blocks 522-536 involve identifying the combination that is associated with the lowest MSE. Prior to measuring MSE, however, the ADC loop is allowed to optimize. The loop coefficients are then set to the combination that results in CDR lock and has the lowest MSE. At this point the initialization phase terminates and the loops enter a tracking phase.

The initialization phase commences at block 502 (e.g., after a hard or soft reset). At this point all of the loops are frozen (adaptation disabled) and the coefficients are set to a default value.

As represented by block 504, the AGC loop is then enabled. Once the AGC loop locks, the output swing of the AGC loop (e.g., signal 211 in FIG. 2) will be set to the desired value.

At block 506, the search engine commences the first lock detect phase. As discussed above, the type, number and values of the coefficients for a given phase may be defined as a result of empirical testing, simulations, analysis or any other method of selecting the coefficients that indicates that these values are most likely to provide CDR lock. Here, a tradeoff may be made between the number of combinations in the first group versus the percentage of systems or configurations for which at least one combination in the group results in CDR lock.

In some embodiments the first phase includes 6 settings (e.g., 6 different combinations of loop parameters). For example, the first phase may include three possible phase adjust settings of 8, 16 and 24 (out of potential settings of 0 to 31). Hence, the phase adjust settings are essentially spread over the range of the possible 32 settings. The first phase also may include CTF settings of 0 and 16 (out of potential settings of 0 to 30).

In some embodiments, the DFE coefficients may be held constant. For example, G2 may be set to 0 and G1 may be set to 16 (out of potential settings of 0 to 31).

In some embodiments the ADC setting may be fixed as well. For example, the ADC settings may be set to the middle of the range (e.g., set C_ADC to 0 for a range of −7 to +7).

At blocks 508-512 an attempt is made to acquire lock for the CDR. This process may involve a frequency acquisition phase and a phase acquisition phase. The DLL adaptation loop may be enabled during this time to provide a coarse alignment between the ADC clock (e.g., clock signal 269) and the 10 GHz clock (e.g., clock signal 231).

As represented by block 508, the CDR is initially configured to lock to a reference clock (frequency acquisition phase). In this way, the CDR will be locked to a frequency that is very close to the frequency of the clock that generated the received signal. The search engine then monitors a lock detect signal (not shown in FIGS. 2 or 3) from the CDR circuit to determine when the CDR has locked (block 510).

During the phase acquisition phase, represented by block 512, the CDR is configured to attempt to lock to the incoming signal (e.g., signal 225 in FIG. 2). The length of time that the search engines waits for the lock detect signal may be programmable. In one embodiment, the wait period is on the order of 400 µS. If lock has not been detected by the end of the time period the process proceeds to block 514.

If the CDR locked to the incoming signal the current coefficient combination is logged. For example, an array (e.g., Lock_Set[i]) indexed by an index value (e.g., "i") corresponding to the current combination may be set to indicate a lock condition.

At block 514, the search engine determines whether all of the combinations of the current phase have been checked. If not, at block 516 the loop settings are set to the next coefficient combination in the current phase (e.g. a next one of the six combinations in the first phase). The process then returns to block 508 to determine whether CDR lock may be obtained with the new combination.

If, at block 514, CDR lock was attempted with all of the combinations for the first phase the process proceeds to block 518. If none of the combinations resulted in CDR lock the search engine proceeds to the next phase (block 520). As discussed above, a second phase may contain a group of combinations that are different than the combinations in the first phase. The combinations in the second phase may be selected so that CDR lock may be achieved in systems and under conditions other than those that typically achieve lock during first phase. In addition, the next phase or phases may include a larger number of combinations to improve the likelihood that CDR lock may be achieved.

In one embodiment the second phase includes 24 settings. For example, the phase may include five possible phase adjust settings of 0, 8, 16, 24 and 31 (out of potential settings of 0 to 31). Again, the phase adjust settings are spread over a range of the possible 32 settings. The second phase also may include CTF settings of 0, 16 and 30 (out of potential settings of 0 to 30). In addition, for the DFE settings, G1 may be set to 16 and 30 (out of potential settings of 0 to 31). Again, G2 may be maintained at 0. In the second phase, however, the combinations from the first phase will not be repeated. Hence, of the 30 possible combinations from the above settings only 24 (30–6) will be used.

The process thus returns to block 508 and the loop consisting of blocks 508-516 is repeated to determine which, if any, of these 24 combinations results in CDR lock. If, at block 514, CDR lock was attempted with all of the combinations for the second phase the process proceeds to block 518.

Assuming lock was achieved with at least one combination during the process of blocks 508-518, the process proceeds to block 522. At blocks 522-524, the ADC loop adaptation is enabled to allow the ADC loop to optimize. Initially, the DLL loop may be enabled to provide a coarse alignment between the ADC clock and the 10 GHz clock. In addition, the loop settings are set to one of the combinations (e.g., the first combination) that resulted in CDR lock. Of note is that the ADC loop as described herein is based on a relative error measurement. Hence, as discussed above, the ADC loop is essentially independent of the channel. In other words, the ADC loop would typically converge to the same value regardless of which combination of coefficients was selected for the CTF, DFE, phase adjust and threshold adjust loops.

At block 522 the search engine allows the ADC loop to acquire a sufficient number of samples to obtain a reliable relative error measurement. In one embodiment the number of cycles (of, e.g., the 155 MHz sampling clock 269) for each ADC setting includes 6 cycles for an ADC update and 130 cycles to accumulate relative error for the current ADC setting. With 15 ADC settings the number of clock cycles is thus 2040. In addition, 8 cycles are added to this total for waiting for the next accumulation. Accordingly, the ADC adaptation loop completes in 2048 samples in this example.

As represented by block 524, the operations of block 522 are repeated to ensure that the ADC loop has optimized. In one embodiment the process is repeated 524 times. At block 526, the search engine sets the ADC coefficient based on the relative error measurements. In one embodiment, the ADC coefficient is set to provide the smallest relative error value.

At blocks 528-534 the search engine determines which one of the combinations that resulted in CDR lock provides the lowest MSE. Initially at block 528, the search engine sets the loop settings to one of the combinations. As represented by block 530, the search engine waits to determine whether the CDR still locks for that combination. If so, the search engine calculates an MSE for that combination. For example, the system may accumulate and process the digitized soft decision signal 291 to generate an MSE value as discussed above. Each MSE value may then be stored in a data memory.

At block 534, the search engine determines whether an MSE calculation has been performed for each of the combinations that resulted in CDR lock. If not the process returns to block 528 where the loop settings are set to the next combination.

If at block 534 all of the combinations have been tried, the loop setting are set to the combination that resulted in the lowest MSE (block 536). At block 538 the search engine again verifies that the CDR is locking for this combination.

Finally, at block 540 the initialization phase terminates and the receiver is set to a tracking phase until the system is reset. In the tracking phase, the other loops (threshold adjust, DFE LMS and CDR phase adjust) are enabled and each loop is allowed to adapt to its optimum value.

Figure 6:
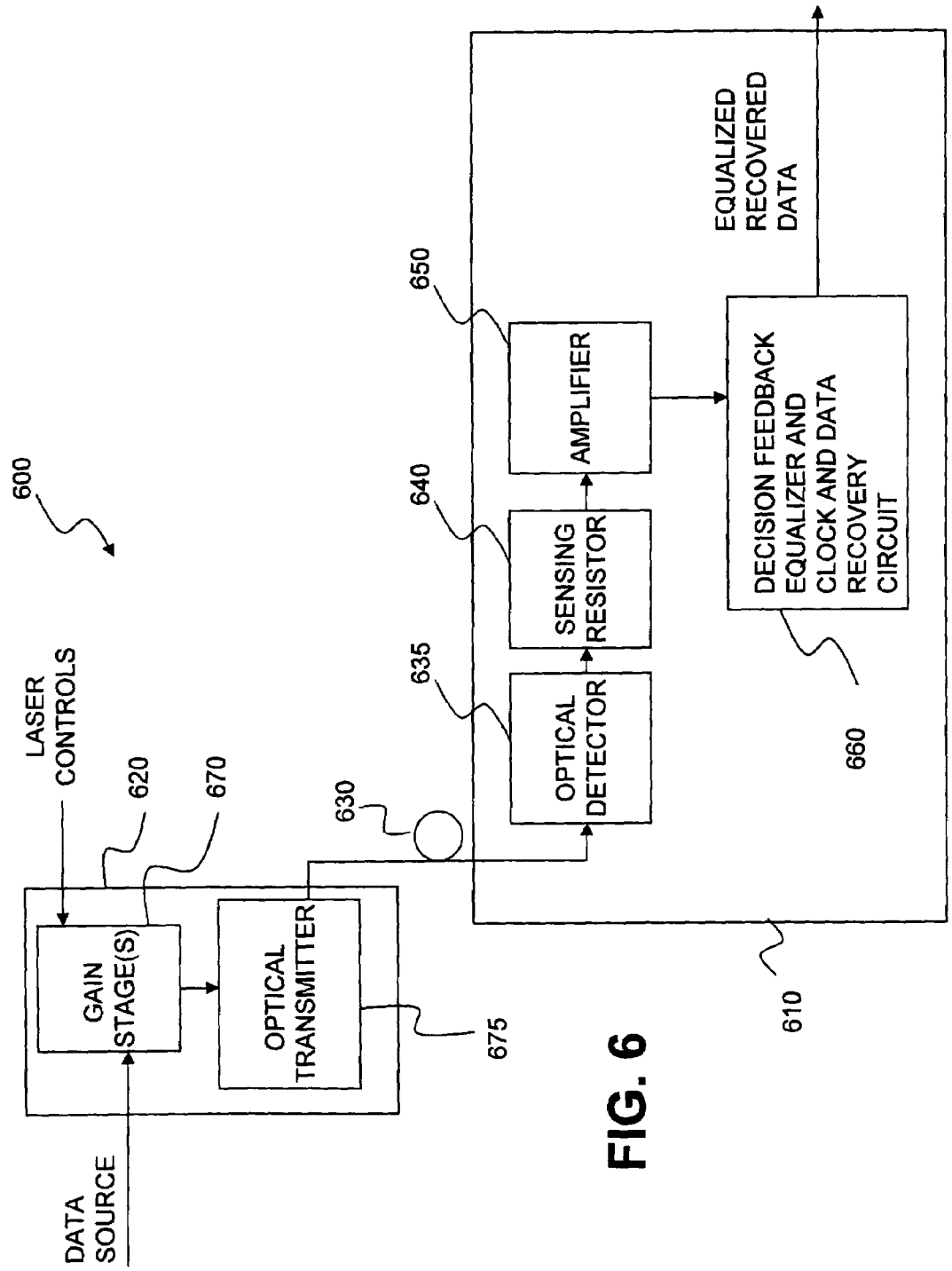
FIG. 6 is a simplified block diagram of one embodiment of an optical communication system.

The teachings herein may be incorporated into a variety of applications. For example, referring to FIG. 6, the described circuits may be incorporated into an optical receiver assembly 610 of an optical communication system 600. The optical system 600 includes an optical transmitter 620 and an optical fiber network 630 that carries the optical signal to the optical receiver assembly 610. Those skilled in the art will appreciate that the present invention is not limited to a single optical transmitter and receiver. That is, optical communications systems may incorporate one or more optical transmitters as well as one or more optical receivers.

The illustrated receive path includes an optical detector 635, sensing resistor 640, one or more amplifiers 650 and a decision feedback equalizer and clock and data recovery circuit 660. The optical detector 635 can be any known prior art optical detector. Such prior art detectors convert incoming optical signals into corresponding electrical output signals that can be electronically monitored.

A transmit path includes, by way of example, one or more gain stage(s) 670 coupled to an optical transmitter 675. In one embodiment an analog data source provides an analog data signal that modulates the output of the optical transmitter. In other embodiments baseband digital modulation or frequency modulation may be used. In this embodiment the gain stage(s) amplify the incoming data signal and the amplified data signal in turn drives the optical transmitter 675.

The gain stage 670 may have multiple stages, and may receive one or more control signals for controlling various different parameters of the output of the optical transmitter. The optical transmitter may, for example, be a light emitting diode or a surface emitting laser or an edge emitting laser that operates at high speeds such as 10 Gigabits per second (Gbps) or higher.

A receive fiber optic cable 630 carries an optical data signal to the optical detector 635. In operation, when the transmitted optical beam is incident on a light receiving surface area of the optical detector, electron-hole pairs are generated. A bias voltage applied across the device generates a flow of electric current having an intensity proportional to the intensity of the incident light. In one embodiment, this current flows through sensing resistor 640, and generates a voltage.

The sensed voltage is amplified by the one or more amplifiers 650 and the output of amplifier 650 drives the decision feedback equalizer. As illustrated in FIG. 3, the decision feedback equalizer includes, by way of example, a slicer that generates a binary signal (D) that drives the clock and data recovery circuit. The clock and data recovery circuit generates an extracted clock signal from the binary signal which is provided to a retimer (e.g., as illustrated in FIG. 4) to retime the equalized data.

It should be appreciated that the various components and features described herein may be incorporated in a system independently of the other components and features. For example, a system incorporating the teachings herein may include various combinations of these components and features. Thus, not all of the components and features described herein may be employed in every such system.

Different embodiments of the invention may include a variety of hardware and software processing components. In some embodiments of the invention, hardware components such as controllers, state machines and/or logic are used in a system constructed in accordance with the invention. In some embodiments code such as software or firmware executing on one or more processing devices may be used to implement one or more of the described operations.

Such components may be implemented on one or more integrated circuits. For example, in some embodiments several of these components may be combined within a single integrated circuit. In some embodiments some of the components may be implemented as a single integrated circuit. In some embodiments some components may be implemented as several integrated circuits.

The components and functions described herein may be connected/coupled in many different ways. The manner in which this is done may depend, in part, on whether the components are separated from the other components. In some embodiments some of the connections represented by the lead lines in the drawings may be in an integrated circuit, on a circuit board and/or over a backplane to other circuit boards. In some embodiments some of the connections represented by the lead lines in the drawings may comprise a data network, for example, a local network and/or a wide area network (e.g., the Internet).

The signals discussed herein may take several forms. For example, in some embodiments a signal may be an electrical signal transmitted over a wire while other signals may consist of light pulses transmitted over an optical fiber.

A signal may comprise more than one signal. For example, a signal may consist of a series of signals. Also, a differential signal comprises two complementary signals or some other combination of signals. In addition, a group of signals may be collectively referred to herein as a signal.

Signals as discussed herein also may take the form of data. For example, in some embodiments an application program may send a signal to another application program. Such a signal may be stored in a data memory.

The components and functions described herein may be connected/coupled directly or indirectly. Thus, in some embodiments there may or may not be intervening devices (e.g., buffers) between connected/coupled components.

A wide variety of devices may be used to implement the data memories discussed herein. For example, a data memory may comprise flash memory, one-time-programmable (OTP) memory or other types of data storage devices.

In summary, the disclosure herein generally relates to an improved search engine. While certain exemplary embodiments have been described above in detail and shown in the accompanying drawings, it is to be understood that such embodiments are merely illustrative of and not restrictive of the broad invention. In particular, it should be recognized that the teachings of the invention apply to a wide variety of systems and processes. It will thus be recognized that various modifications may be made to the illustrated and other embodiments of the invention described above, without departing from the broad inventive scope thereof. In view of the above it will be understood that the invention is not limited to the particular embodiments or arrangements disclosed, but is rather intended to cover any changes, adaptations or modifications which are within the scope and spirit of the invention as defined by the appended claims.

What is claimed is:

1. A method of identifying a coefficient for a receive equalizer comprising:
   identifying sets of coefficients associated with a lock condition by:
      determining whether a clock recovery circuit in a receiver locks when at least one equalizer component in the receiver is configured with each of a first group of the sets of coefficients, and
      if the clock recovery circuit does not lock when the at least one equalizer component is configured with the sets of coefficients from the first group, determining which, if any, sets of coefficients from a second group of sets of coefficients cause the clock recovery circuit to lock when the at least one equalizer component is configured with sets of coefficients from the second group;
   calculating a mean square error associated with a received signal when the at least one equalizer component is configured with each of the identified sets of coefficients; and
   selecting, based on the mean square error calculation, one of the identified sets of coefficients.

2. The method of claim 1 wherein: the at least one equalizer component comprises a plurality of equalizer components; each of the sets of coefficients comprises a plurality of coefficients; and determining comprises sequentially configuring the equalizer components with each set of coefficients.

3. The method of claim 1 comprising defining a plurality of groups of the sets of coefficients, wherein the determining comprises initially determining whether the clock recovery circuit locks when the at least one equalizer component is configured with sets of coefficients from a first one of the groups.

4. The method of claim 3 wherein, if the clock recovery circuit does not lock when the at least one equalizer component is configured with sets of coefficients from the first group, the determining comprises determining whether the clock recovery circuit locks when the at least one equalizer component is configured with sets of coefficients from a second one of the groups.

5. The method of claim 4 wherein calculating comprises calculating a mean square error associated with a received signal when the at least one equalizer component is configured with a set of coefficients from the second group.

6. The method of claim 4 comprising enabling optimization of a clock loop for an analog to digital converter in the receiver before calculating the mean square error.

7. The method of claim 1 comprising enabling optimization of a clock loop for an analog to digital converter in the receiver before calculating the mean square error.

8. The method of claim 1 wherein an analog to digital converter samples the received signal to provide data for the mean square error calculation.

9. The method of claim 8 comprising enabling optimization of a clock loop for the analog to digital converter before calculating the mean square error.

10. The method of claim 9 wherein the optimizing is associated with aligning a clock for the analog to digital converter with a clock for a retimer that retimes the received signal.

11. The method of claim 1 wherein selecting comprising selecting a set of coefficients associated with a lowest mean square error.

12. The method of claim 1 wherein determining comprises sequentially configuring the at least one equalizer component with each of the sets of coefficients.

13. The method of claim 1 wherein the coefficients in each set are predefined.

14. The method of claim 1 wherein the means square error is only calculated when the equalizer is configured with an identified set of coefficients.

15. The method of claim 1 wherein the at least one equalizer component comprises at least one of a continuous time filter, a phase adjust circuit for the clock recovery circuit and a decision feedback equalizer.

16. The method of claim 1 wherein the identifying, calculating and selecting are performed when the receiver is initialized.

17. The method of claim 1 wherein the identifying, calculating and selecting are performed before invoking a tracking mode.

18. A method of identifying a coefficient combination for a receive equalizer comprising:
   defining a plurality of groups of coefficient combinations for equalizer components in a receiver;
   identifying coefficient combinations from a first one of the groups that enable a clock recovery circuit to lock to a received signal;
   if the clock recovery circuit does not acquire lock for any of the coefficient combinations from the first set, identifying coefficient combinations from a second one of the groups that enable the clock recovery circuit to lock to the received signal;
   calculating a mean square error associated with the received signal when the equalizer components are configured with each of the identified coefficient combinations; and
   selecting, based on the mean square error calculation, one of the identified coefficient combinations.

19. The method of claim 18 wherein the first group includes a smaller number of coefficient combinations than the second group.

20. The method of claim 18 wherein the first group includes a collection of coefficient combinations associated with a high probability of the clock recovery acquiring lock under a variety of operating conditions.

21. The method of claim 18 wherein the coefficient combinations in the first group comprise continuous time filter coefficients and coefficients for a phase adjust circuit for the clock recovery circuit but not decision feedback equalizer coefficients.

22. The method of claim 21 wherein the coefficient combinations in the second group comprise decision feedback equalizer coefficients.

23. The method of claim 18 comprising enabling optimization of a clock loop for an analog to digital converter in the receiver before calculating the mean square error.

24. A communications system comprising:
   a continuous time filter (CTF) for filtering a received signal in accordance with at least one CTF coefficient generated by a first adaptation loop;
   a decision feedback equalizer (DFE) adapted to reduce channel related distortion in the received signal in accordance with at least one DFE coefficient generated by a second adaptation loop;
   a clock recovery circuit adapted to recover a clock signal from the received signal; and
   a search engine configured to select an initial set of coefficients for at least one of the adaptation loops from a plurality of sets of coefficients, the search engine configured to:
      identify sets of coefficients associated with a lock condition by:
         determining whether the clock recovery circuit locks when at least one of the adaptation loops is configured with each of a first group of the sets of coefficients, and
         if the clock recovery circuit does not lock when the at least one of the adaptation loops is configured with the sets of coefficients from the first group, determining which, if any, sets of coefficients from a second group of sets of coefficients cause the clock recovery circuit to lock when the at least one of the adaptation loops is configured with sets of coefficients from the second group;
      obtain a mean square error derived from the received signal when the at least one of the adaptation loops is configured with each of the identified sets of coefficients; and
      select, based on the mean square error calculation, one of the identified sets of coefficients as the initial set of coefficients.

25. The system of claim 24 comprising: an analog to digital converter, clocked by a sampling clock signal, to generate data for the adaptation loops; and a mean square error component configured to calculate the mean square error in accordance with the data.

26. The system of claim 25 comprising: a delay lock loop for generating the sampling clock; and a relative error adaptation loop adapted to adjust a phase of the sampling clock in accordance with a comparison of data from two different data paths.

27. The system of claim 25 comprising a phase adjust circuit for adjusting a phase of the clock signal in accordance with at least one phase adjust coefficient generated by a third adaptation loop.

28. The system of claim 24 comprising a clock loop for an analog to digital converter wherein the clock loop is allowed to optimize before the mean square error is obtained.

29. A communication receiver comprising:
   an automatic gain control circuit for amplifying a received signal;
   a continuous time filter for filtering the amplified signal in accordance with at least one filter coefficient generated by a first MSE adaptation loop;
   a decision feedback equalizer adapted to reduce channel related distortion in the filtered signal, the decision feedback equalizer comprising:
      a summer that combines the filtered signal with at least one equalized feedback signal generated by an LMS adaptation loop and generates a soft decision signal;
      a slicer adapted to convert the soft decision signal to a binary signal; and
      a retimer adapted to generate an equalized data signal from the binary signal in response to an extracted clock signal;
   a clock and data recovery circuit configured to generate the extracted clock signal from the binary signal, the clock and data recovery circuit comprising a phase adjust circuit adapted to adjust a phase of the extracted clock signal in accordance with at least one phase coefficient generated by a second MSE adaptation loop;
   a delay lock loop for generating a sampling clock signal from the extracted clock signal; a relative error adaptation loop adapted to adjust a phase of the sampling clock signal in accordance with a comparison of a digitized soft decision signal and the equalized data signal;

an analog to digital converter, clocked by the adjusted sampling clock signal, for sampling the soft decision signal to generate the digitized soft decision signal for at least a portion of the adaptation loops; and a search engine adapted to select an initial set of coefficients for at least one of the adaptation loops from a plurality of sets of coefficients, the search engine configured to:

identify sets of coefficients associated with a lock condition by determining whether the clock and data recovery circuit locks when at least one of the adaptation loops is configured with each of the sets of coefficients;

obtain a mean square error derived from the digitized soft decision signal when the at least one of the adaptation loops is configured with each of the identified sets of coefficients; and select, based on the mean square error calculation, one of the identified sets of coefficients as the initial set of coefficients.

* * * * *

UNITED STATES PATENT AND TRADEMARK OFFICE
CERTIFICATE OF CORRECTION

PATENT NO. : 7,630,466 B2
APPLICATION NO. : 11/281204
DATED : December 8, 2009
INVENTOR(S) : Momtaz et al.

Page 1 of 1

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 942 days.

Signed and Sealed this

Twenty-first Day of December, 2010

David J. Kappos
*Director of the United States Patent and Trademark Office*